(12) United States Patent
Bard et al.

(10) Patent No.: US 10,697,080 B2
(45) Date of Patent: Jun. 30, 2020

(54) ONE-STEP GROWTH OF A DENSE, PHOTORESPONSIVE SILICON FILM IN MOLTEN CALCIUM CHLORIDE

(71) Applicant: The Board of Regents of The University of Texas System, Austin, TX (US)

(72) Inventors: Allen J. Bard, Austin, TX (US); Huayi Yin, Austin, TX (US)

(73) Assignee: Board of Regents of the University of Texas System, Austin, TX (US)

( * ) Notice: Subject to any disclaimer, the term of this patent is extended or adjusted under 35 U.S.C. 154(b) by 114 days.

(21) Appl. No.: 15/572,321

(22) PCT Filed: May 6, 2016

(86) PCT No.: PCT/US2016/031237
§ 371 (c)(1),
(2) Date: Nov. 7, 2017

(87) PCT Pub. No.: WO2016/179506
PCT Pub. Date: Nov. 10, 2016

(65) Prior Publication Data
US 2018/0112323 A1    Apr. 26, 2018

Related U.S. Application Data

(60) Provisional application No. 62/158,179, filed on May 7, 2015.

(51) Int. Cl.
| | |
|---|---|
| *C25D 3/66* | (2006.01) |
| *C25D 9/04* | (2006.01) |
| *H01L 21/02* | (2006.01) |
| *H01L 31/18* | (2006.01) |
| *C25D 9/08* | (2006.01) |

(Continued)

(52) U.S. Cl.
CPC ............. *C25D 9/04* (2013.01); *C25B 1/006* (2013.01); *C25D 9/08* (2013.01); *C25D 21/12* (2013.01); *H01L 21/02376* (2013.01); *H01L 21/02425* (2013.01); *H01L 21/02532* (2013.01); *H01L 21/02603* (2013.01); *H01L 21/02628* (2013.01); *H01L 22/14* (2013.01); *H01L 31/182* (2013.01); *H01L 31/1804* (2013.01); *H01L 21/02576* (2013.01); *H01L 21/02579* (2013.01); *H01L 21/02625* (2013.01); *H01L 31/0445* (2014.12);
(Continued)

(58) Field of Classification Search
CPC .................................. C25B 1/006; C24D 3/66
USPC ......................................................... 205/230
See application file for complete search history.

(56) References Cited

U.S. PATENT DOCUMENTS

2015/0050816 A1* 2/2015 Bae ................... H01L 21/02126
438/787

FOREIGN PATENT DOCUMENTS

CN            101979712 A   *   2/2011   ............... C25B 1/00

OTHER PUBLICATIONS

Elwell et al., "Electrolytic production of silicon", Journal of Applied Electrochemistry, 1988, 18, 15-22. (Year: 1988).*

(Continued)

*Primary Examiner* — Edna Wong
(74) *Attorney, Agent, or Firm* — Kowert, Hood, Munyon, Rankin & Goetzel, P.C.; Mark R. DeLuca

(57) ABSTRACT

Photoactive silicon films may be formed by electrodeposition from a molten salt electrolyte. In an embodiment, $SiO_2$ is electrochemically reduced in a molten salt bath to deposit silicon on a carbonaceous substrate.

10 Claims, 16 Drawing Sheets

(51) Int. Cl.
C25B 1/00 (2006.01)
C25D 21/12 (2006.01)
H01L 21/66 (2006.01)
H01L 31/0445 (2014.01)
H01L 31/068 (2012.01)

(52) U.S. Cl.
CPC .......... *H01L 31/068* (2013.01); *Y02E 10/546* (2013.01); *Y02P 70/521* (2015.11)

(56) References Cited

OTHER PUBLICATIONS

Cho et al. "Formation of a silicon layer by electroreduction of SiO2 nanoparticles in CaCl2 molten salt", Electrochimica Acta, 65, 2012, 57-63 (Year: 2012).*

Elwell et al. "Electrolytic production of silicon", Journal of Applied Electrochemistry, 18, 1988, 15-22 (Year: 1988).*

Xiao et al. "Verification and implications of the dissolution-electrodeposition process during the electro-reduction of solid silica in molten CaCl2" RSC Advances, 2012, 2, 7588-7593 (Year: 2012).*

Nishihara et al. "Conversion of silica nanoparticles into Si nanocrystals through electrochemical reduction", Nanoscale, 2014, 6, 10574 (Year: 2014).*

* cited by examiner

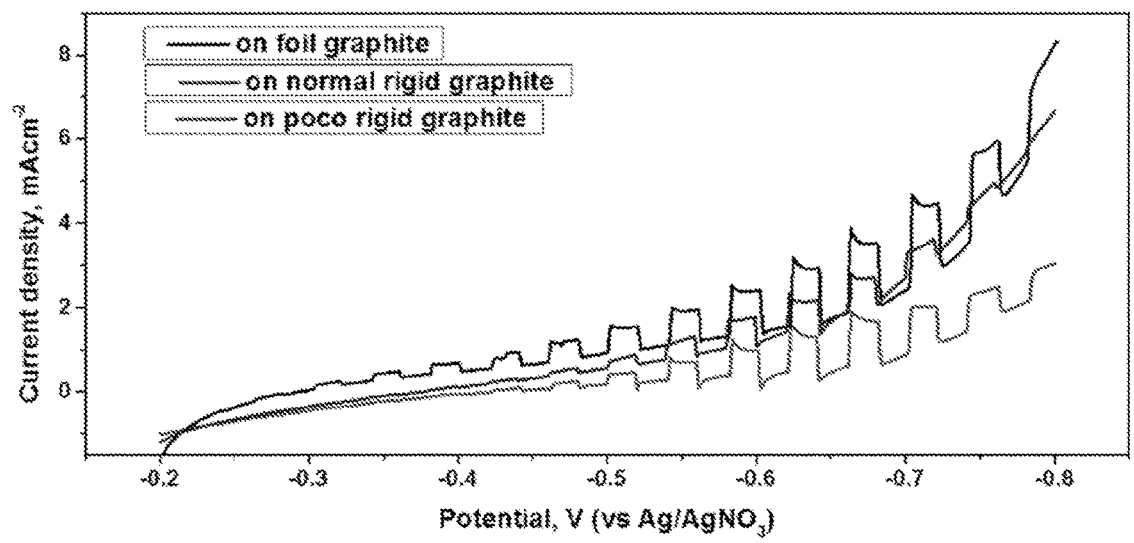
FIG. 7A
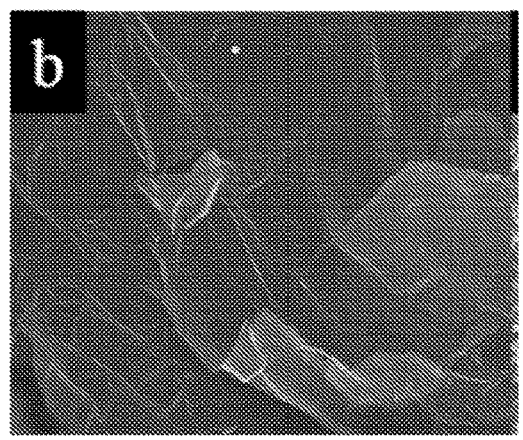 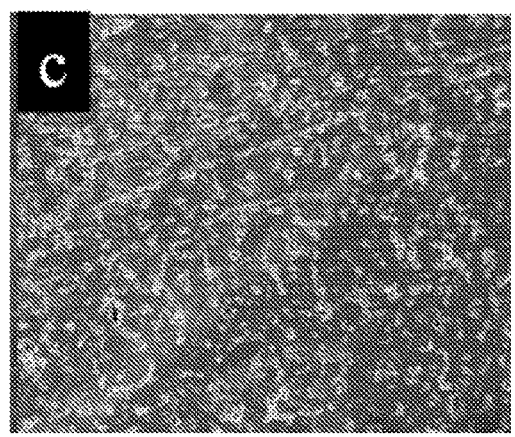
FIG. 7B  FIG. 7C

ONE-STEP GROWTH OF A DENSE, PHOTORESPONSIVE SILICON FILM IN MOLTEN CALCIUM CHLORIDE

BACKGROUND OF THE INVENTION

1. Field of the Invention

The invention generally relates to methods of forming high purity silicon. More specifically, the invention relates to electrochemical formation of silicon from silicon oxide nanoparticles.

2. Description of the Relevant Art

Silicon has been recognized as one of the most important materials for photovoltaic and electronic devices due to its earth-abundance and intrinsic physicochemical properties. Currently, commercial polycrystalline Si is produced by carbothermal reduction of $SiO_2$ and subsequently the as-received Si is refined by the Siemens Process, which requires high energy input and is harmful to the environment. Therefore, a facile, controllable and environmental sound manner for direct producing highly photoresponsive Si is attracting growing attention all over the world nowadays.

Electrochemical deposition of Si in organic solvents, room temperature ionic liquids, and high-temperature molten salts is of great interest because of the straightforward process and low cost. Due to the poor electrical conductance of Si at room temperature, however, it is hard to prepare a thick and dense Si layer by electrodeposition at room temperature. As the electrical resistance of Si is significantly reduced at elevated temperatures, high-temperature molten salts are considered good candidates for electrochemical deposition of Si because of its wide electrochemical window, high ionic conductivity and low cost. Electrodeposition of Si in molten fluoride by reducing a $K_2SiF_6$ precursor has been realized. However, dendric deposits formed during this process are detrimental to the continuous process and lead to crystallographic defects in the formed Si. Dendric Si also contains more impurities, which significantly affect the applications of the deposited Si.

Electroreduction of solid oxides in molten $CaCl_2$ has opened an avenue for extracting metals/semimetals without forming dendric products. Direct electrochemical reduction of $SiO_2$ in molten $CaCl_2$ has been proved to be a fast, energy-efficient, low-cost approach to producing Si. Although this process is energy-efficient and prevents growing dendric Si product, the slow kinetics of $O_2$ diffusion happening at the three-phase interline (3PI) needs to be solved for efficient large-scale production. In addition, the Si powder obtained by reduction of solid silica is generally melted and then sliced into wafers, which increases the capital cost of electrodeposited Si.

More recently, electrodeposition of a p-type Si coating on a silver foil in molten $CaCl_2$-nano-$SiO_2$ melt showed good photoresponse properties. In this process, nano-$SiO_2$ was employed as the Si precursor and Ag acted both as substrate and catalyst for growing a Si coating in the form of platelets. Due to the high cost of Ag the cost of this process is high. Moreover, the use of Ag constrains the applied electrochemical potential window of the electrolysis. An affordable and suitable substrate besides Ag is important to engineer the growing process, reduce the cost, tailor the morphology and improve the photoresponse of electrodeposited Si.

SUMMARY OF THE INVENTION

A method of depositing silicon on a substrate includes electrochemically reducing silicon dioxide nanoparticles or micron-sized particles in a molten salt to deposit silicon on a carbonaceous substrate. The carbonaceous substrate may be graphite. The silicon may be deposited as wires (e.g., nanowires) or a film.

Generally, the molten salt is at a temperature of less than about 1000° C. In some embodiments, the molten salt comprises calcium chloride. A doped silicon film may be produced by adding boron, phosphorus or arsenic to the molten salt to produce a doped silicon film on the metal substrate.

The physical properties of the deposited silicon (e.g., the morphology) may be altered by adjusting a current density used to deposit the silicon on the carbonaceous substrate.

The method may be used to produce a photovoltaic device having a silicon film on a carbonaceous substrate. The silicon film may have a purity of at least 99.99%, preferably 99.999%, most preferably at least 99.9999%.

BRIEF DESCRIPTION OF THE DRAWINGS

Advantages of the present invention will become apparent to those skilled in the art with the benefit of the following detailed description of embodiments and upon reference to the accompanying drawings in which:

FIG. 7A depicts PEC plots of the silicon film deposited on graphite foil, normal graphite and POCO graphite;

FIG. 7B depicts an SEM image of graphite foil;

FIG. 7C depicts an SEM image of normal graphite;

Figure 1:
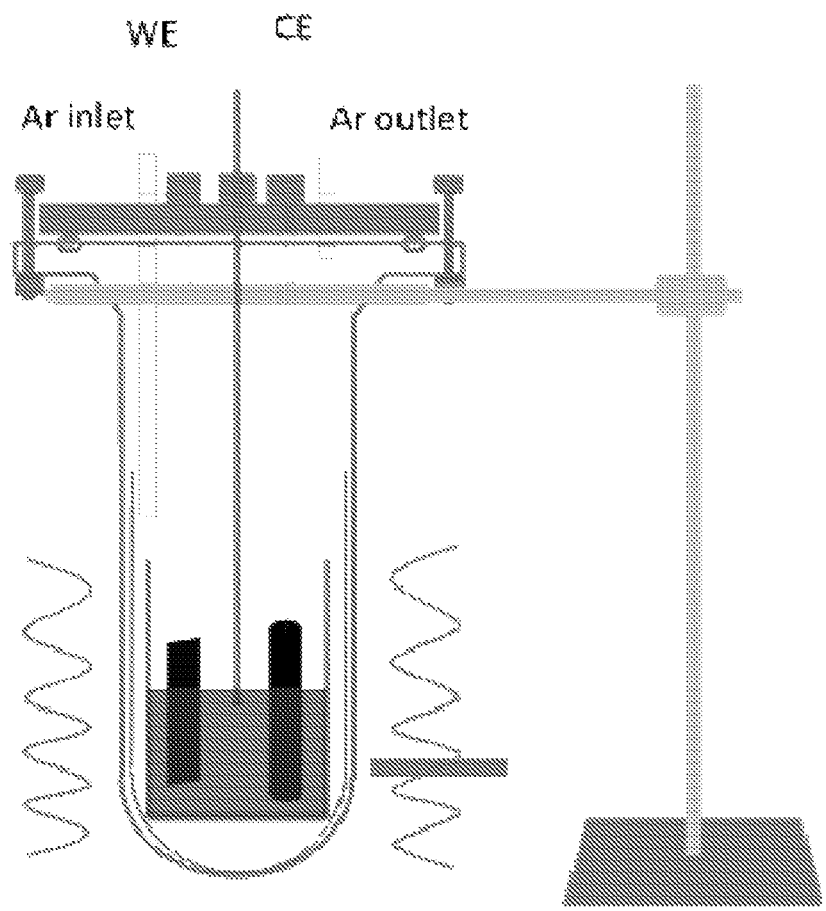
FIG. 1 depicts a schematic diagram of a device used to form a silicon film on a carbonaceous substrate.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

It is to be understood the present invention is not limited to particular devices or methods, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

In an embodiment, a silicon layer can be produced on a carbonaceous substrate from $SiO_2$ nanoparticles or microparticles added into a molten electrolyte salt. Generally, the process is accomplished by forming a melt of the electrolyte and the silicon nanoparticles. The melt is treated with a reducing current between a working electrode of the carbonaceous substrate and a counter electrode. The counter electrode is a carbon based electrode (e.g., a glassy carbon electrode or a graphite rod). During reduction, silicon is deposited onto the working electrode to form a silicon film on the surface of the working electrode. The silicon film, in some embodiments, has a purity of at least about 99.99%. Preferably, the silicon film has a purity of at least about 99.999%. Most preferably, the silicon film has a purity of at least about 99.9999%. Exemplary carbonaceous substrates include, but are not limited to, graphite, active carbon, carbon fiber, and carbon nanotubes.

Electrodeposition

FIG. 1 depicts a schematic diagram of a device used to form a silicon film on a carbonaceous substrate. The vessel is an assembly comprised of a one-end-sealed quartz-flanged tube (o.d. 52 mm, length 500 mm) with an O-ring and a stainless steel lid, a one-end-sealed lining quartz tube (o.d. 45 mm, length 300 mm), and an alumina crucible (i.d. 33 mm, length 95 mm, 99.95%, AdValue Technology, Tucson, Ariz.). The flange lid has O-ring structured holes through which the conducting wires with electrodes are inserted. $CaCl_2 \cdot 2H_2O$ (calcium chloride dihydrate, ACS, 99 to 105%, Alfa Aesar, Haverhill, Mass.) was baked at 180° C. in a vacuum oven for a minimum of 12 hours before use.

In a typical experiment, 0.5 g $SiO_2$ nanoparticles (silicon dioxide, 10-20 nm particle size, 99.5%, Aldrich, St. Louis, Mo.) and 50 g $CaCl_2$ was weighed and poured into a narrow-mouth bottle and then mixed using a blender at 2000 rpm for 2 min. After mixing, the mixture was poured into the dry alumina crucible and then placed into the lining tube and finally the quartz-flanged tube. The lid was affixed and the entire vessel was sealed. The bottom part of the vessel was heated in a tube furnace (Model F21135, 1350 W, Thermo Scientific, Waltham, Mass.) in a vacuum for 2 hours at 400° C. to remove moisture. With argon gas (99.95%) purging into the vessel, the furnace was heated to 850° C. and the electrodeposition conducted. The salt bath was approximately 30 mm in depth and the temperature difference within that region was less than 10° C. The working electrode (cathode) was a graphite strip from one of several different graphite sources: a) POCO graphite (AXF-5Q, Entegris POCO, Decatur, Tex.) cut to 75×6×1 mm, b) McMaster graphite (premium grade, McMaster Carr, Elmhurst, Ill.), cut to 75×6×1 mm, or c) carbon foil, (0.5 mm thickness, 99.8%, Aldrich, St. Louis, Mo.) cut to 75×7 mm. Solid graphites a) and b) were polished by sandpapers (600 and 1200 grit MicroCut Discs, Buehler, Lake Bluff, Ill.) to a mirror finish. The counter electrode was a graphite rod (0.25" graphite rod, 99.995%, Alfa Aesar, Haverhill, Mass.). The rod was cut to a length of 75 mm and immersed into the salt bath at 25 mm. The electrode leads were tungsten wires (d. 1 mm, length 600 mm), each sealed in a quartz tube by epoxy on top. A graphite connector made from a graphite rod was used to connect the tungsten wire and electrode, with molybdenum wire (d. 0.25 mm) binding the graphite electrode onto the graphite connector.

The cathode was immersed about 20 mm into the bath and electrodeposition experiments were carried out at a constant current using an Autolab B.V. potentiostat (Metrohm). After the deposition, the cathode was removed slowly and held in the vessel above the bath in an argon atmosphere to cool down. Then the sample was taken out from the vessel, thoroughly rinsed with water followed by ethanol, and dried in an oven at 120° C.

Photoelectrochemical (PEC) Characterization of the Deposit

Electrodeposited Si films on graphite or silver substrates were cut into 6 mm×6 mm squares to prepare working electrodes for PEC measurement. A Si deposit on one edge of a substrate was then removed by mild polishing to provide an area for electrical contact made by connecting a Cu wire to the polished side with Cu tape. The exposed geometric area of the Si film was defined at about 0.24 cm$^2$ by applying chemically inert epoxy (Loctite 1C-LV, Hysol) to insulate the rest of the electrode. Epoxy-covered electrodes were then dried overnight in air.

Figure 2:
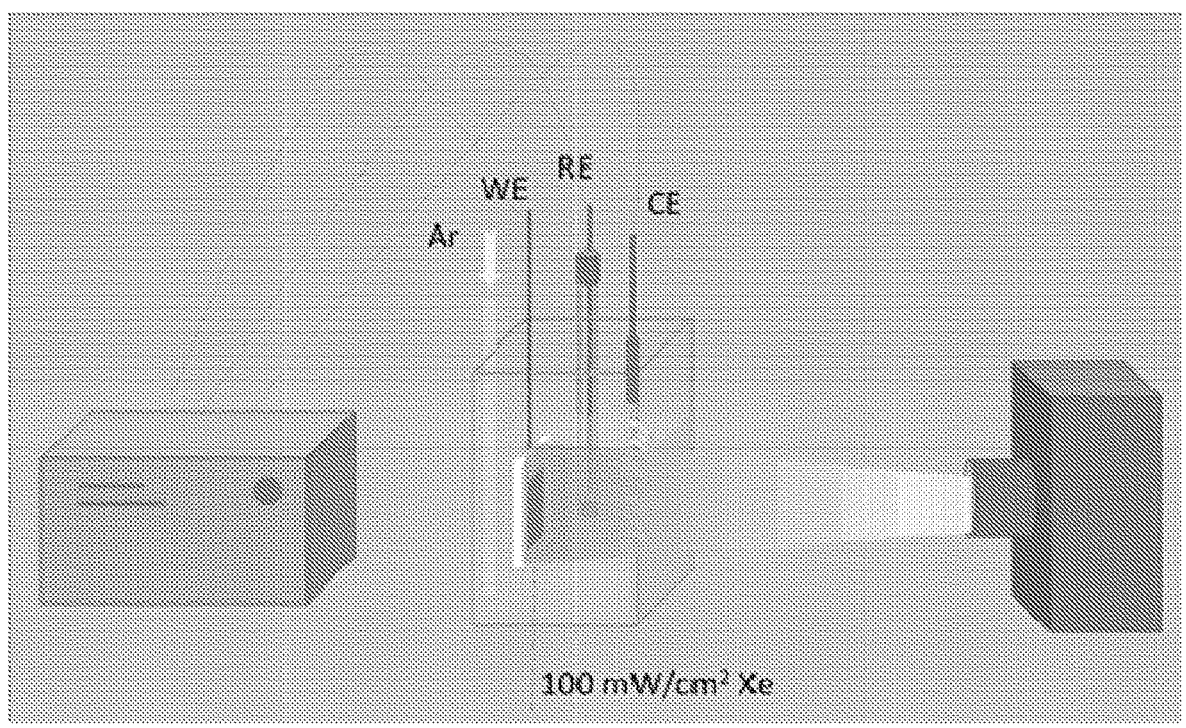
FIG. 2 depicts a schematic diagram of the PEC testing device.

PEC measurements were carried out in a 1-mm-thick quartz glass cell (W: 25.4 mm, L: 25.4 mm, H: 50 mm) using a three-electrode configuration with a Pt-wire counter electrode and non-aqueous Ag/AgNO$_3$ (0.01 M in MeCN) reference electrode (W-2062, BAS). FIG. 2 depicts a schematic diagram of the PEC testing device. The electrolyte was Ar-purged MeCN (CH$_3$CN, 99.9%, Extra Dry, Acros, Fair Lawn, N.J.) containing 0.1 M tetrabutylammonium hexafluorophosphate (TBAPF$_6$, ≥99.9%, Fluka, Allentown, Pa.) as supporting electrolyte and 0.05 M ethyl viologen diperchlorate (EV(ClO$_4$)$_2$, 98%, Sigma-Aldrich, St. Louis, Mo.) as a redox agent. The potential and current of Si films were measured with a scan rate of 10 mV/s under UV-visible light irradiation using a CHI 760E potentiostat (CH Instruments, Austin, Tex.). The working electrode under test was irradiated through the electrolyte by using a Xe lamp (Oriel, 150 W) with light intensity of 100 mW/cm$^2$ at the electrode surface, assuming negligible electrolyte absorption. A single crystalline Si wafer (5-10 ohm·cm, (100), boron-doped, University Wafers, Boston, Mass.) was used as a standard working electrode. Ohmic contact to the Si wafer was made by thermal evaporation of Au (30 nm) on the back. The rest of the working electrode preparation, for example masking with epoxy, was the same as above. To remove native silicon oxides before electrochemical measurements, all Si electrodes were immersed in a 5 M hydrofluoric acid solution (HF, 48-51% in water, Acros, Fair Lawn, N.J.) for 5 min, and then rinsed with deionized water and then MeCN.

Materials Characterization

Silicon films were characterized by scanning electron microscopy (SEM, Quanta 650 FEG, FEI Company, Inc., Hillsboro, Oreg.) equipped for energy dispersive spectroscopy (EDS, XFlash Detector 5010, Bruker, Fitchburg, Wis.), and time-of-flight secondary-ion mass spectroscopy (TOF-SIMS, Perkin-Elmer, Model ULVAC-PHI TFS2000 system equipped with a Bi-ion source), X-ray photoelectron spectroscopy (Kratos XPS, Kratos Analytical Ltd., UK) equipped with a monochromatic Al X-ray source, and X-ray diffraction spectroscopy (XRD, Philips X-ray diffractometer equipped with Cu Kα radiation).

Photoelectrochemical Cell Test Methodology for Semiconductor Film

Rather than fabricating a p-n junction to test these films in a solid-state photovoltaic (PV) cell, a simpler way to characterize photoactive semiconductor materials is to assemble a photoelectrochemical (PEC) cell by making a semiconductor/liquid junction with the film to be tested and adding a counter electrode. In this way, technical problems can be avoided arising from interface contact or from multiple variable parameters in full device architecture and solid-state fabrication. In contrast, the semiconductor/liquid junction in a PEC cell is relatively reliable (if proper liquid electrolyte is employed) and the PEC cell structure is very simple and easy to realize in a chemistry lab.

Figure 3:
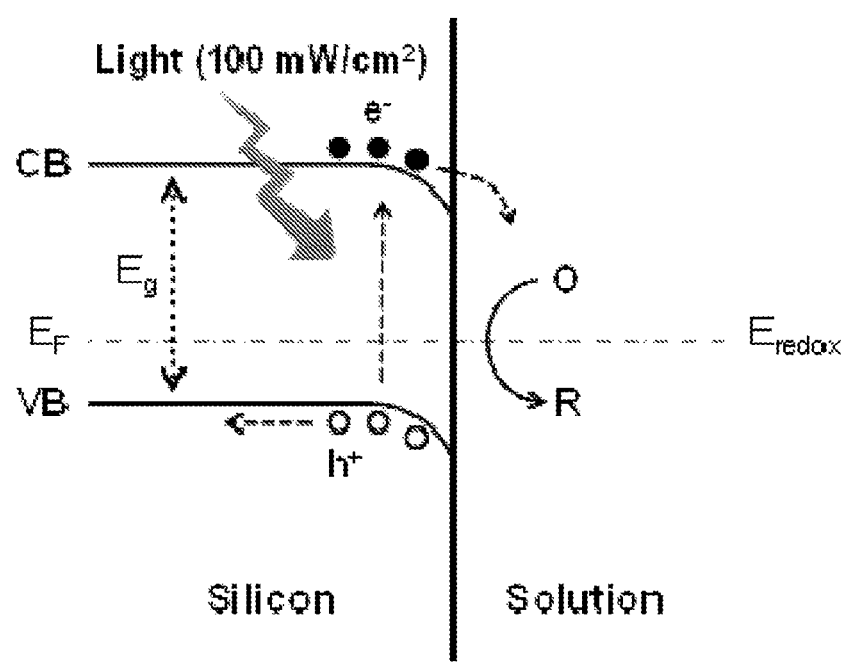
FIG. 3 depicts a schematic diagram of p-type Si/liquid junction with redox agent.

FIG. 3 depicts a schematic diagram of p-type Si/liquid junction with redox agent, where CB and VB stand for conduction band and valence band, EF and Eg are Fermi level and band gap of Si, and E$_{redox}$ is standard reduction potential of redox agent. Photoelectrochemical reduction of redox reagent occurs when the electrode is irradiated by light having enough energy to excite electrons through the band gap (Eg), producing a photocurrent. Electrons in the conduction band (CB) that are consumed to reduce the redox agent determine the amount of photocurrent; these electrons are continuously transferred from the back contact. Some electrons are not utilized in the reduction process because of energy loss mechanisms, such as electron-hole recombination. In the absence of light, no photocurrent flows, as there are no electrons available for photoelectrochemical reduction in the conduction band. However, if there are pinholes exposing a conductive substrate or impurities in the semiconductor electrode, a general electrochemical reduction reaction may take place even without light. This electrochemical current is called dark current and qualitatively indicates the extent to which defect sites are present at the semiconductor electrode surface.

Figure 4A:
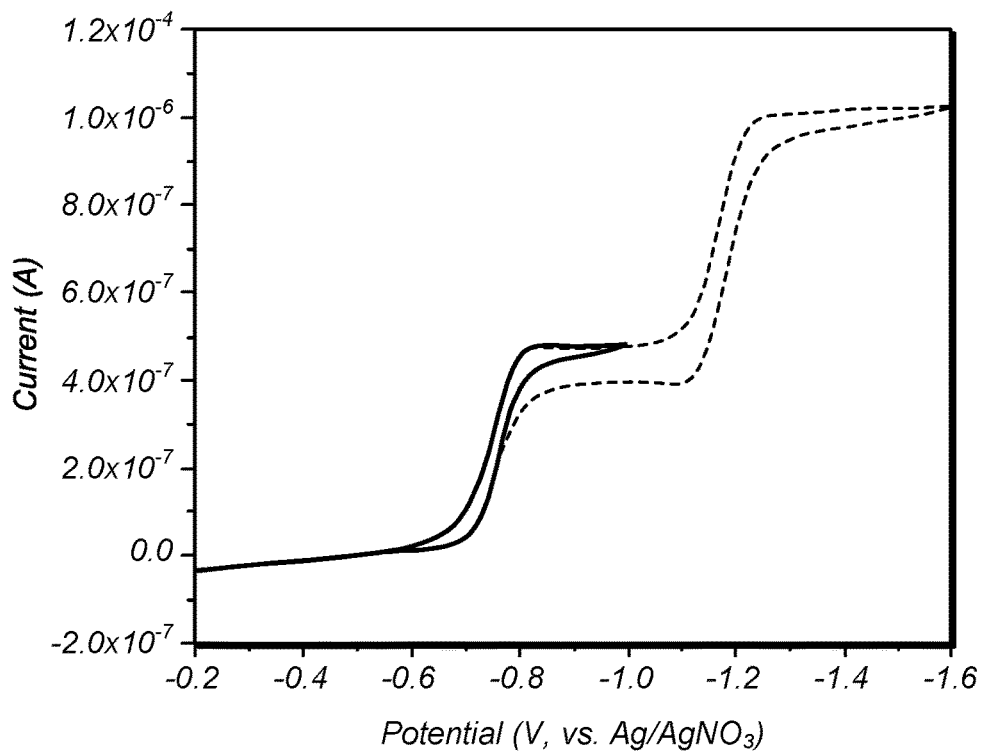
FIG. 4A depicts the redox reactions of $EV^{2+/+}$ and $EV^{+/0}$.
Figure 4B:
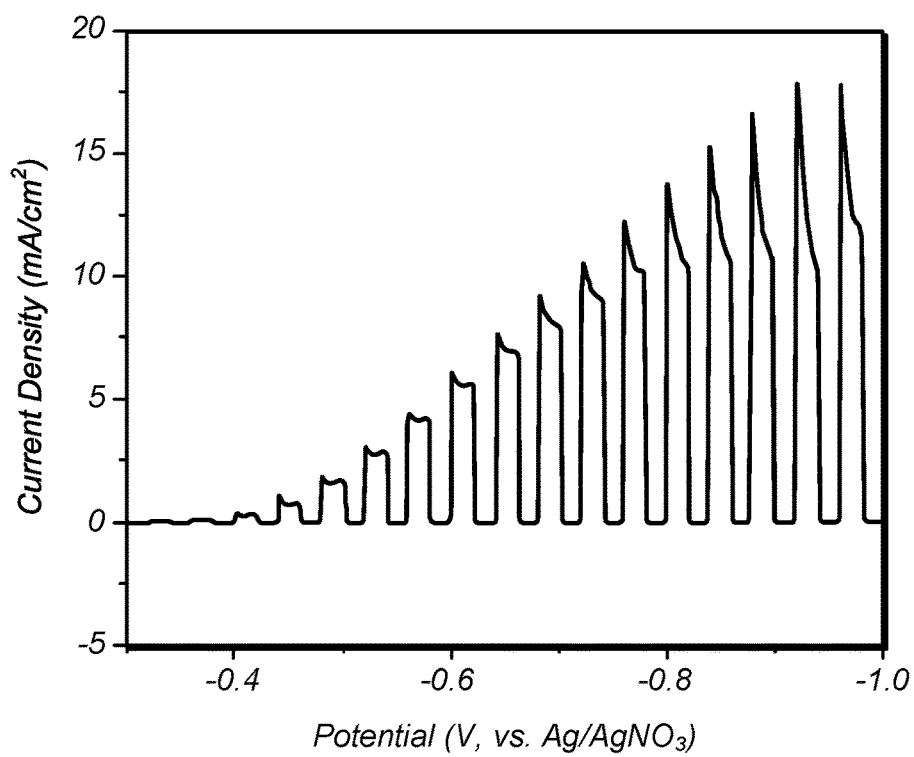
FIG. 4B depicts photoelectrochemical behavior of a p-type Si wafer electrode.

In this study, we chose ethyl viologen (EV$^{2+}$) as a redox reagent in acetonitrile (MeCN) solvent because the redox reaction of EV$^{2+/+}$ is a reversible, single-electron, outer-sphere reaction that is independent of electrode material, while its standard reduction potential is within the Si band gap. The light absorbance of EV$^{2+}$ is also relatively low compared to other available redox chemicals. The redox reactions of EV$^{2+/+}$ and EV$^{+/0}$ on a Au disk electrode (d. 25 µm) in MeCN are shown in FIG. 4A. Two reversible redox reactions were clearly observed with half-wave potentials (E$_{1/2}$) of −0.75 V and −1.16 V vs Ag/AgNO$_3$ for the first and second reduction steps, respectively. These correlate with previously reported values, −0.48 V and −0.89 V vs Ag/AgCl (saturated KCl). The potential of Ag/AgNO$_3$ (0.01 M in MeCN) is about 0.34 V vs Ag/AgCl (saturated KCl) in aqueous media. FIG. 4B shows photoelectrochemical behavior of a p-type Si wafer electrode (5-10 ohm·cm, (100), boron-doped, University Wafers, Boston, Mass.) in the system. A photocurrent due to photoelectrochemical reduction of EV$^{2+}$ was obtained when light was illuminated while no photocurrent was measured in the dark.

The short-circuit current density (J$_{sc}$) at −0.75 V vs Ag/AgNO$_3$ was about 10 mA/cm$^2$. The ideal maximum photocurrent density under illumination of 100 mW/cm$^2$ (AM 1.5 G) for p-type Si is 44 mA/cm$^2$ based on the conventional Shockley-Quisser limit for solar cell energy conversion. The tested Si wafer electrode didn't meet the maximum photocurrent because other factors, such as non-radiative recombination of photo-generated charge carriers, light reflection, or charge transfer resistance from semiconductor to redox agent, may degrade the photocurrent. About 9.3 mA/cm$^2$ of short-circuit current density (J$_{sc}$) was previously reported with EV$^{2+}$ at p-type Si (3 ohm·cm, under 100 mW/cm$^2$). Some investigations were performed with methyl viologen (MV$^{2+}$), which has a similar standard reduction potential to that of EV$^{2+}$. Typical J$_{sc}$ of MV$^{2+}$ reduction in aqueous media has been reported as 20 (±3) mA/cm$^2$ on p-type Si (0.6-0.8 ohm·cm) under 60 mW/cm$^2$ of 808 nm illumination, producing a photon flux above the Si band gap analogous to that obtained from broadband illumination (100 mW/cm$^2$, AM 1.5). The photoelectrochemical behavior of electrodeposited Si on silver and graphite was measured similarly. Because E$_{1/2}$ for the EV$^{2+/+}$ reaction was measured at −0.75 V vs Ag/AgNO$_3$ (0.01 M in MeCN) in MeCN, J$_{sc}$ for the electrodeposited Si film can be considered to be the photocurrent density at −0.75 V. However, a significant amount of dark current from the electrodeposited Si film at −0.75 V, due to pinholes in the deposit, disturbed the accurate measurement of J$_{sc}$. For quantitative comparison with a standard p-type Si wafer electrode, the photocurrent density value was measured at −0.62 V where the dark current was negligible.

Graphite Substrate

Here we report that a graphite substrate can be used for electrodeposition of a silicon film using $SiO_2$ nanoparticles as silicon feedstock in molten $CaCl_2$.

Figure 5A:
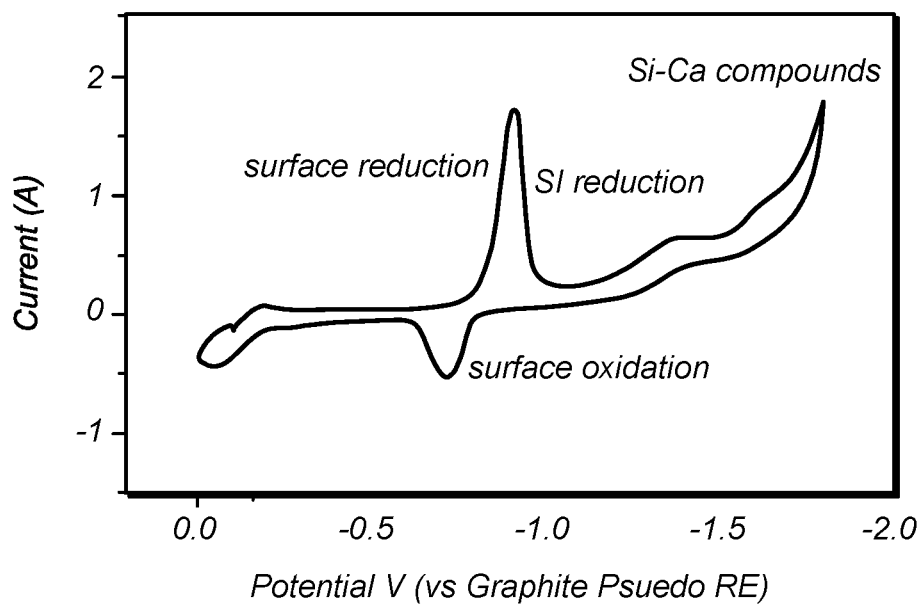
FIG. 5A depicts cyclic voltammetry of graphite at 850° C. in $CaCl_2$ containing 0.3 M $SiO_2$ nanoparticles.
Figure 5B:
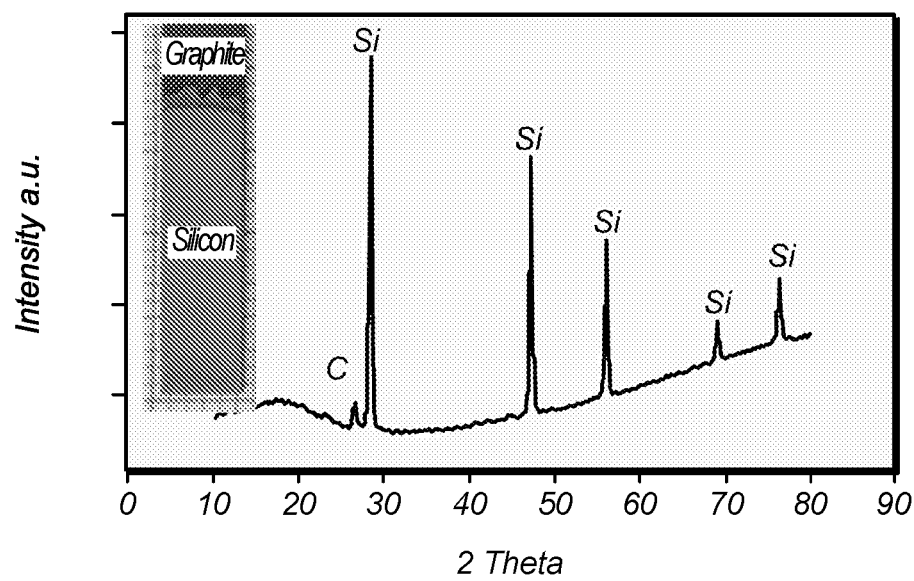
FIG. 5B depicts XRD patterns of the as prepared silicon film on graphite, with inset digital picture of the deposit.
Figure 5C:
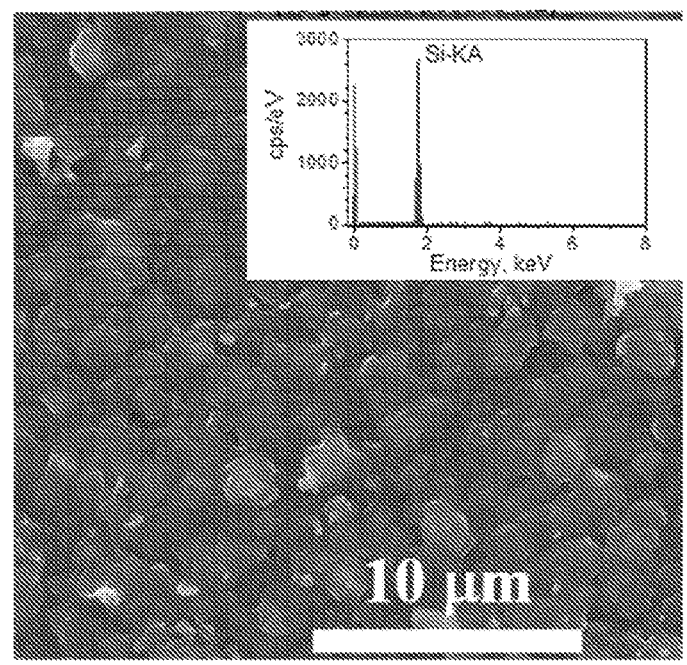
FIG. 5C depicts a typical top view SEM image of the deposit silicon on graphite, with inset EDX spectrum.
Figure 5D:
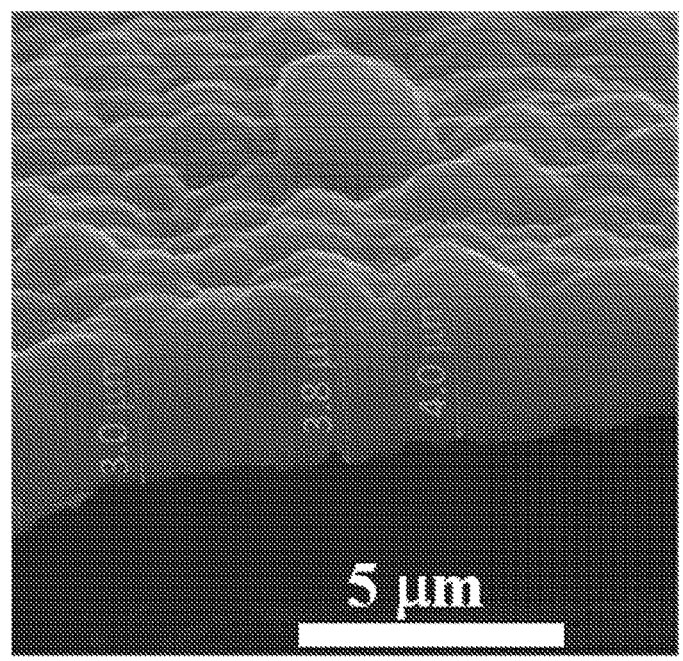
FIG. 5D depicts a cross sectional SEM image on a film peeled off from the graphite substrate.

FIG. 5A depicts cyclic voltammetry of graphite (d. 3 mm×length 2 mm) at 850° C. in $CaCl_2$ containing 0.3 M $SiO_2$ nanoparticles. FIG. 5B depicts XRD patterns of the as prepared silicon film on graphite, with inset digital picture of the deposit. FIG. 5C depicts a typical top view SEM image of the deposit silicon on graphite, with inset EDX spectrum. FIG. 5D depicts a cross sectional SEM image on a film peeled off from the graphite substrate.

A typical cyclic voltammogram for reduction of $SiO_2$ nanoparticles on graphite in $CaCl_2$ bath is shown in FIG. 5A. The reduction on graphite is similar to the process on silver, where the reduction curve starts at −1.1 V versus a graphite pseudo-reference electrode. A typical silicon film on graphite appears uniform with a light blue-grey color (FIG. 5B inset), and XRD patterns (FIG. 5B) show that the film is polycrystalline with no preference in crystalline direction. A top-view SEM image (FIG. 5C) shows a film composed of crystalline grains of several microns in size and well covered, with low impurities as measured by EDX (FIG. 5C inset). From one cross-sectional SEM image (FIG. 5D), the dense film produced by deposition at 6 mA/cm² for 1 h is approximately 3-4 μm thick with around 4-μm surface roughness.

Figure 6A:
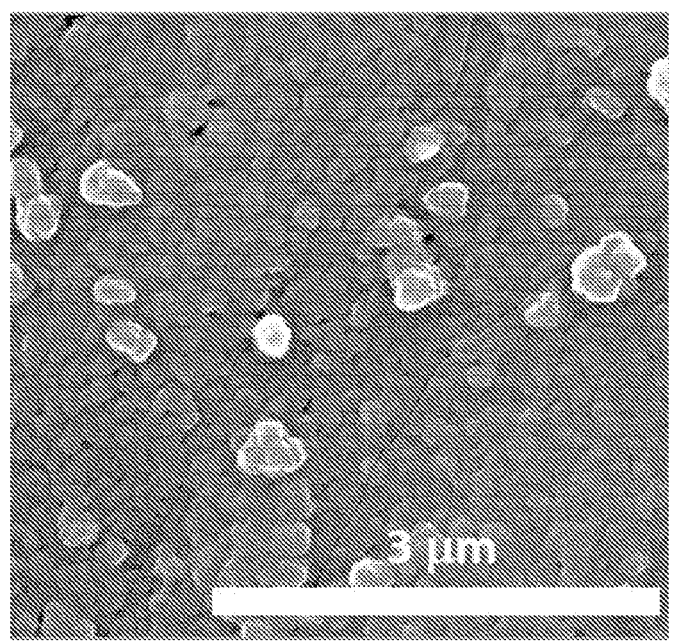
FIG. 6A depicts SEM images of silicon film deposited at 6 mA/cm$^2$ for 2 min.
Figure 6B:
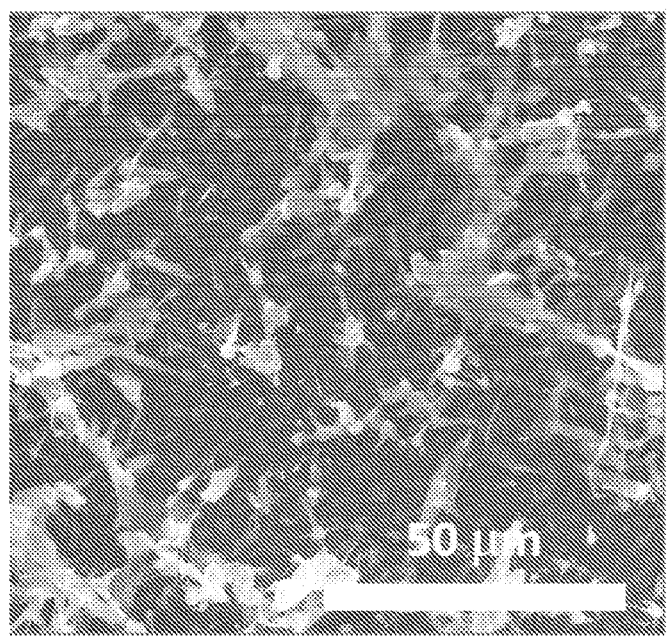
FIG. 6B depicts SEM images of silicon film deposited at 6 mA/cm$^2$ for 3 h.
Figure 6C:
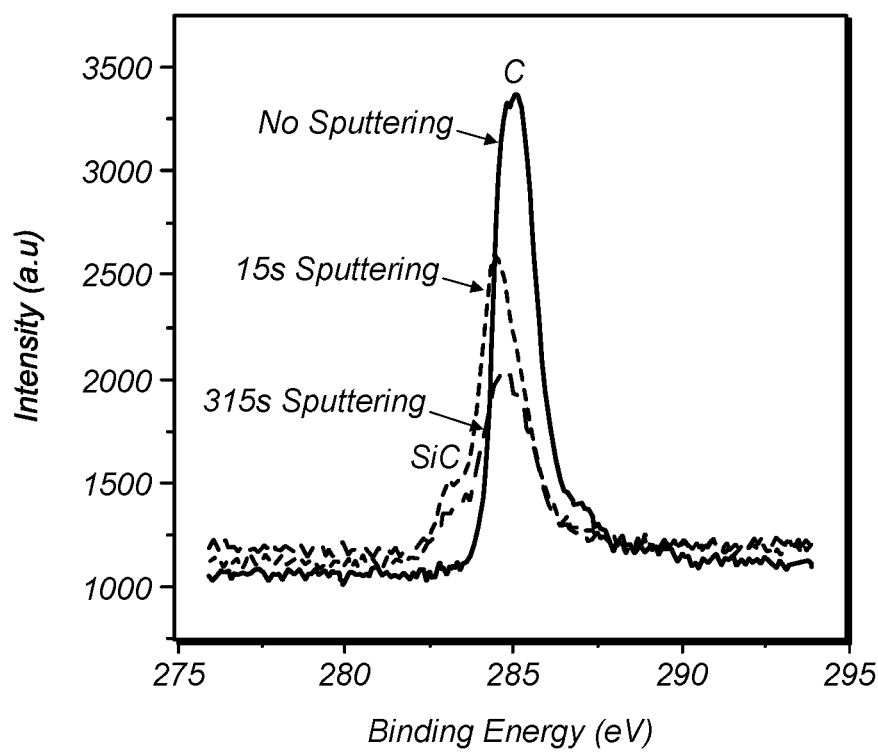
FIG. 6C depicts XPS spectra of the C peak for the 2 min. deposited sample with the sputtering time indicated.
Figure 6D:
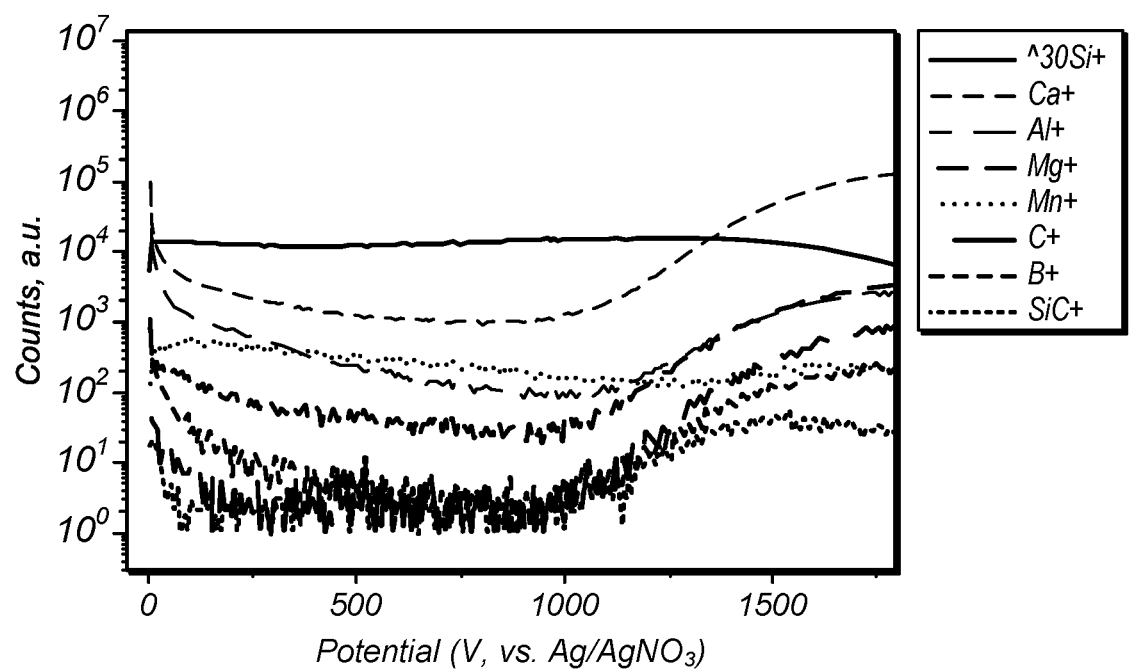
FIG. 6D depicts SIMS profile spectra of sample deposited at 6 mA/cm$^2$ for 1 h.

FIGS. 6A and 6B depict SEM images of silicon film deposited at 6 mA/cm² for 2 min and 3 h, respectively. FIG. 6C depicts XPS spectra of the C peak for the 2 min. deposited sample with the sputtering time indicated. FIG. 6D depicts SIMS profile spectra of sample deposited at 6 mA/cm² for 1 h. At 6 mA/cm², a silicon film was formed within 2 minutes, as shown in FIG. 6A. As the deposition time extended to more than 1 hour at 6 mA/cm², the surface became rougher and a primarily dendritic structure emerged on top of a dense layer (FIG. 6B). From XPS data, it was clear that the dense layer was elemental silicon. Additionally, a silicon carbide layer was identified at the interface of graphite substrate and the silicon film, as shown in XPS data in FIG. 6C and in the SiC signal in the SIMS data in FIG. 6D. At 850° C., the formation of SiC from Si and C is thermodynamically spontaneous (Si+C ⇌ SiC, ΔG=62.8 kJ). So the initial $SiO_2$ reduction on graphite is possibly a combination of electrodeposition and chemical reaction. Our previous results show that although silicon can be reduced from $SiO_2$ nanoparticles, it is difficult to grow a dense silicon film with reasonable thickness on metals substrate like Mo. This SiC interface layer may help to buffer the stress between the silicon film and graphite substrate and assist in forming a coherent dense film of silicon. SIMS profile analysis reveals that impurities distribute mainly on the interface of the graphite substrate and the silicon film (that is, in the same range with the SiC interlayer) and on the top surface of silicon. The major impurities are Ca, Al, Mg, Mn. As discussed further below, the silicon films prepared in this series of experiments are all p-type as deposited. Al and Mg impurities, combined with the existence of B, may explain this p-type behavior.

Figure 7D:
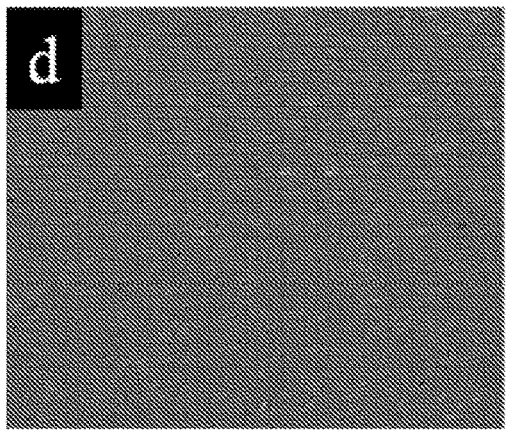
FIG. 7D depicts an SEM image of POCO graphite.
Figure 7E:
FIG. 7E depicts an SEM image of silicon deposits on graphite foil.
Figure 7F:
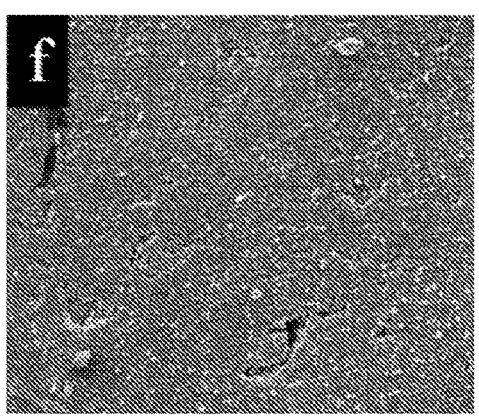
FIG. 7F depicts an SEM image of silicon deposits on normal graphite.
Figure 7G:
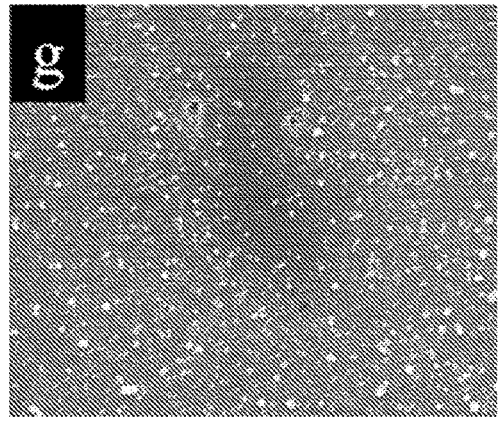
FIG. 7G depicts an SEM image of silicon deposits on POCO graphite.

FIG. 7A depicts PEC plots of the silicon film deposited on graphite foil, normal graphite and POCO graphite. FIGS. 7B-7D depict SEM images of substrates: foil (FIG. 7B), normal (FIG. 7C), and POCO graphite (FIG. 7D). FIGS. 7E-7G depict SEM images of silicon deposits on foil (FIG. 7E), normal (FIG. 7F) and POCO graphite (FIG. 7G). The quality of silicon coverage and the PEC response varied with different types of graphite substrates. As depicted in FIGS. 7B-7D, three kinds of graphite substrates have been tested: soft carbon foil (0.5 mm thick), normal rigid graphite (from McMaster Carr), and POCO graphite (AXF-5Q). The detailed properties of these substrates are listed in Table 1. Generally, graphite foil is a type of soft graphite material composed of compressed exfoliated graphite flakes with a layer-stacked structure and a surface composed of flat graphite flakes. The mechanical strength of carbon foil is too weak to keep its macroscopic shape during heating and cooling. As a result, the film grown on it can be easily cracked (FIG. 7E), which leads to a significant dark current in the PEC test. As portrayed in FIG. 7G, the dark current of silicon film is higher on graphite foil than on POCO graphite, although the photocurrents are similar.

TABLE 1

Properties of different graphite substrates

| PROPERTY | GRAPHITE FOIL | NORMAL GRAPHITE | POCO (AXF-5Q) |
|---|---|---|---|
| Particle size, μm | | 10 | 5 |
| Pore size, μm | | 5 | 0.8 |
| Apparent density, g/cm3 | 1.0 | 1.82 | 1.78 |
| Compressive strength, MPa | 200 | 127 | 138 |
| Electrical resistivity, μΩ · cm | | 1400 | 1470 |
| Ash content, ppm | 5000 | 5000 | 500 |

In contrast to the graphite foil, rigid graphite strips (of either normal graphite and POCO graphite, 1.0 mm thick) are robust enough to avoid cracking during temperature changes. The thermal expansion coefficients are similar (volumetric coefficient of thermal expansion, $\alpha_{V,Si}$=4.68× $10^{-6}$ K$^{-1}$, and $\alpha_{V,graphite}$=6.5×$10^{-6}$ K$^{-1}$),[31] hence thermal stresses between the deposit substrate should be tolerable. As shown in FIGS. 7F-7G, no cracks can be seen in the deposits from these substrates.

However, as shown in Table 1, macro pores exist on the surface of some graphite materials. Normal graphite (5 μm average pore size) contains some macro pores that are larger than the thickness of the silicon film; those places are poorly covered by silicon, leaving an exposed graphite substrate and causing dark current in the PEC test. POCO graphite AXF-5Q (0.8 μm average pore size) has far fewer macro pores on its surface (although still not zero). As a result, the dark current from silicon films is generally less on POCO graphite than on normal graphite. This effect is apparent in FIG. 7A, where the silicon film deposited on normal graphite reveals a high dark current similar to the sample on graphite foil, due to the large area of the defects on the substrate surface. POCO graphite gives the smallest dark current and almost the same (the highest) photocurrent among the three kinds of graphite substrates. For the purpose of preparing dense, pinhole-free silicon films for application in photovoltaic devices, POCO graphite AXF-5Q was chosen as the substrate for further experiments because of its low macro-pore density and consistent quality.

Figure 8A:
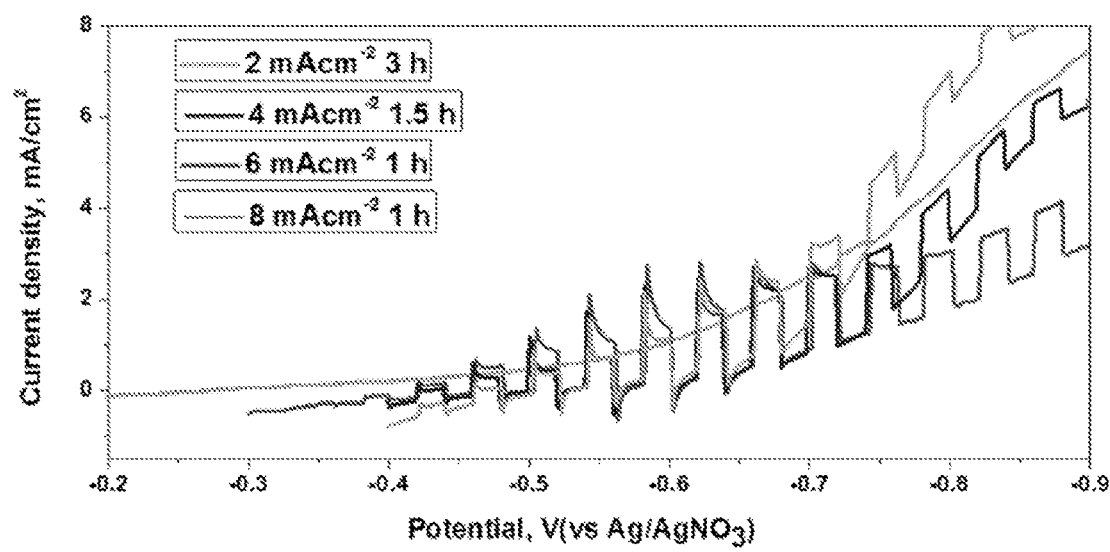
FIG. 8A depicts PEC plots of silicon films prepared by electrodeposition at different current densities from 2 mA/cm$^2$ to 8 mA/cm$^2$.
Figure 8B:
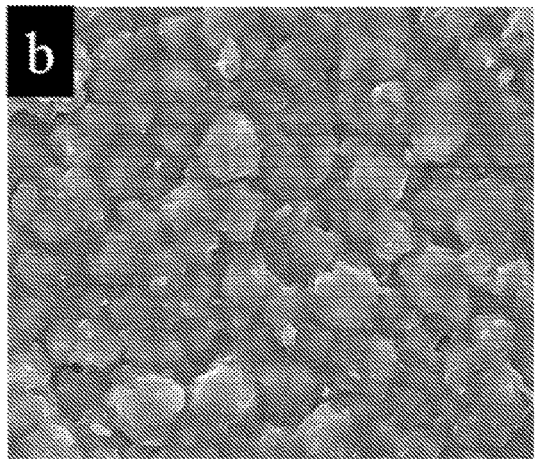
FIG. 8B depicts SEM images of the silicon film electrodeposited at 2 mA/cm$^2$.
Figure 8C:
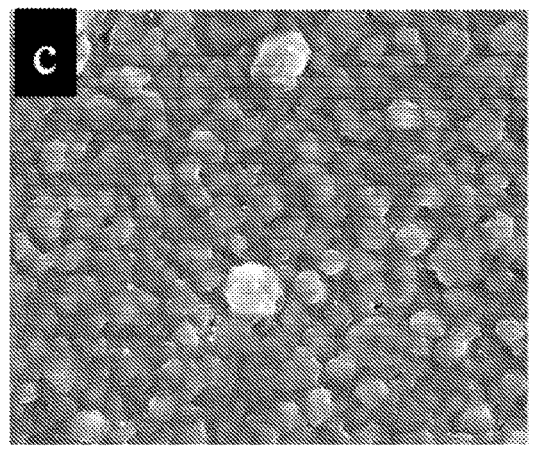
FIG. 8C depicts SEM images of the silicon film electrodeposited at 4 mA/cm$^2$.
Figure 8D:
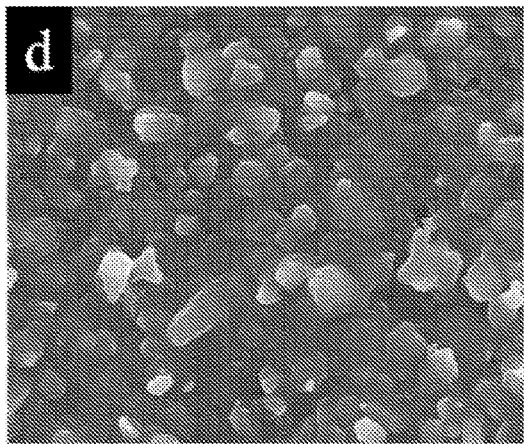
FIG. 8D depicts SEM images of the silicon film electrodeposited at 6 mA/cm$^2$.
Figure 8E:
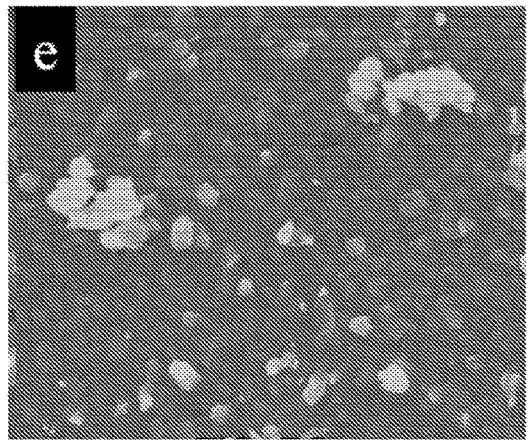
FIG. 8E depicts SEM images of the silicon film electrodeposited at 8 mA/cm$^2$.

The morphology of electrodeposited silicon can be tuned by current density and the quality of the film can be measured by PEC analysis. FIG. 8A depicts PEC plots of silicon films prepared by electrodeposition at different current densities from 2 mA/cm² to 8 mA/cm², but the same overall charge (21.6 C/cm²), in a $CaCl_2$ bath containing 0.3 M $SiO_2$ nanoparticles. FIG. 8B-8E depicts SEM images of the silicon film electrodeposited at 2 mA/cm² (FIG. 8B), 4 mA/cm² (FIG. 8C), 6 mA/cm² (FIG. 8D) and 8 mA/cm² (FIG. 8E). As shown in FIGS. 8B-8E, as current density increased from 2 to 8 mA/cm², the grain size of the film became finer. A synergetic effect from nucleation and growth processes can explain the deposit morphology qualitatively. Lower current density creates a low density of nuclei, causing coarse grain growth and a film with low coverage; higher current density creates a high density of nuclei that is good for a dense film, but the growth process may be mass-transfer limited and diffusion control can result in dendritic morphology. The optimum film with good density and coverage is expected to be deposited at a moderate current density.

FIG. 8A shows the PEC results for four silicon films made at different current densities for different amounts of time, but the same overall charge (21.6 C/cm$^2$). The silicon film deposited at 6 mA/cm$^2$ for 1 h stands out as having both lowest dark current (indicating best coverage of the film) and highest photocurrents (indicating good crystalline structure and good adhesion to substrate). Samples deposited at 4 mA/cm$^2$ for 1.5 h shows almost the same photocurrent as the sample of 6 mA/cm$^2$, but a higher dark current, which is indicative that the crystalline quality of the film is good but the coverage is not as good as 6 mA/cm$^2$ sample. In the SEM image, one can see the similar grain size film morphology between 4 mA/cm$^2$ 1.5 h sample and 6 mA/cm$^2$ 1-h sample (FIGS. 8C-D), although coverage is less uniform. Interestingly, for the 2 mA/cm$^2$ sample, PEC not only reveals the highest dark current among samples in the series, owning to a large number of pinholes among a coarse grain; but also reveals a tiny photocurrent response, which indicates that a bad connection between the silicon film and substrate, which cannot be observed by SEM. For the 8 mA/cm$^2$ sample, the dark current is higher and the photocurrent is lower, compared with the 6-mA/cm$^2$ sample. The lower photocurrent has two possible reasons. First, the silicon film is thinner, because compared with the 6 mA/cm$^2$ 1-h sample, the 8 mA/cm$^2$ 0.75-h sample has more dendrites due to the effect of diffusion control from higher current density deposition. Secondly, at the higher current density the silicon film is composed of smaller grains and has more grain boundaries, which can provide recombination centers that impede transfer of charge carriers. The higher dark current can be from either more grain boundaries or pinholes due to the insufficient growth of the grains around dendrites.

Interestingly, increasing the deposition time in some cases does not improve the quality of the silicon film much. As shown by the PEC test, the photocurrent only increases slightly and dark current decreases slightly. That is due to the current distribution that develops with dendrite structure growth. Since the dendrites are already developed in the one-hour deposition, extending the deposition time will primarily contribute more dendrite structure and not much improve the dense film thickness or the exposed area. These dendrites are brownish in color showing poor connection to the dense silicon film; hence they contribute slightly to the PEC performance. The structure of the films on graphite was not a function of temperature between 800 and 900° C.; the morphology, thickness, and roughness were essentially the same. Similarly a change in the concentration of silicon dioxide between 0.1 and 1.2 M didn't affect the structure.

Figure 9A:
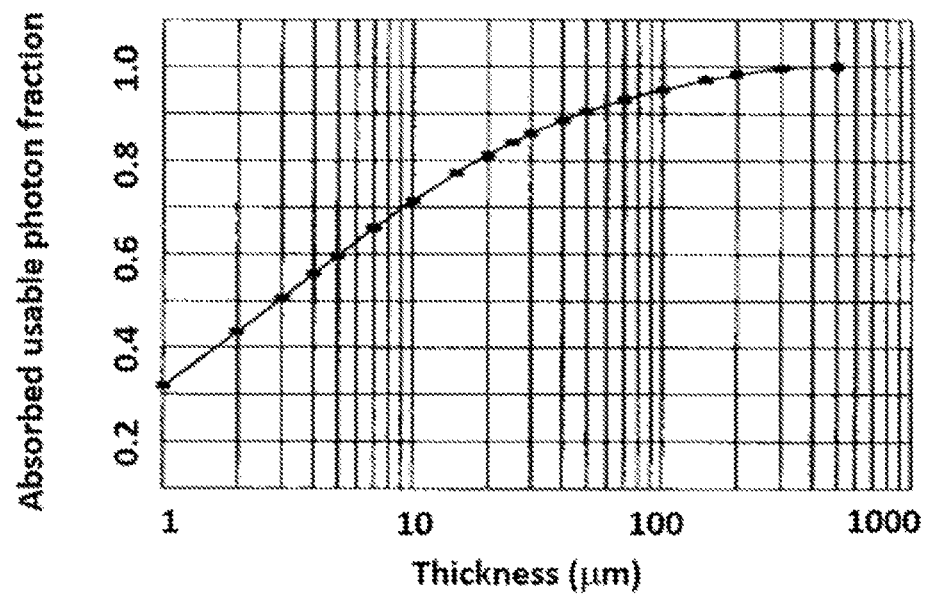
FIG. 9A depicts the photo harvest efficiency of a silicon film deposited on a graphite substrate.
Figure 9B:
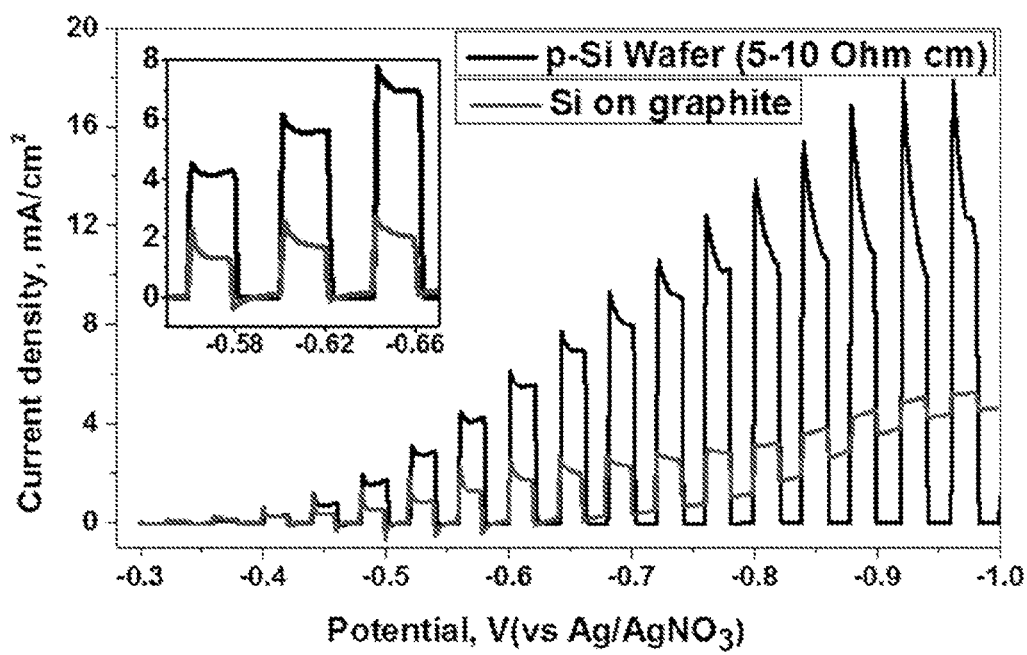
FIG. 9B depicts the photocurrent density of a silicon film deposited on a graphite substrate.

Overall, a coherent, dense, thin silicon film can be electrodeposited on graphite substrate. The optimum conditions observed for electrodeposition were 6 mA/cm$^2$ current density for 1 hour at 850° C. in a molten CaCl$_2$ bath, with 0.3 M SiO$_2$ nanoparticles (Table 2). The best photocurrent density observed for electrodeposited silicon on graphite at −0.62 V vs Ag/AgNO$_3$ was 1.71 mA/cm$^2$ (FIG. 9B), which is 30% of the photoresponse of a silicon wafer. As shown in FIG. 9A, the silicon film has poor photo harvest efficiency. The silicon film has a thickness of less than 4 µm, which is 45 times less than a wafer and light harvested is less than 55% (FIG. 9A). Improved photoresponse from electrodeposited silicon films may be improved by controlling the level of impurities in the process.

Figure 10A:
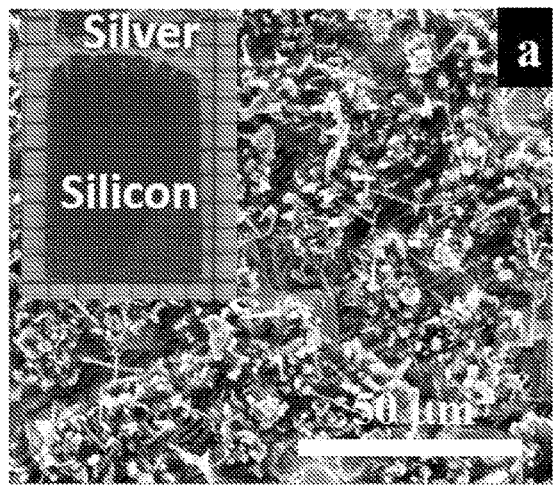
FIG. 10A depicts an SEM top-view image of silicon deposited on silver, with inset digital picture of the as-deposited silicon on silver sample.
Figure 10B:
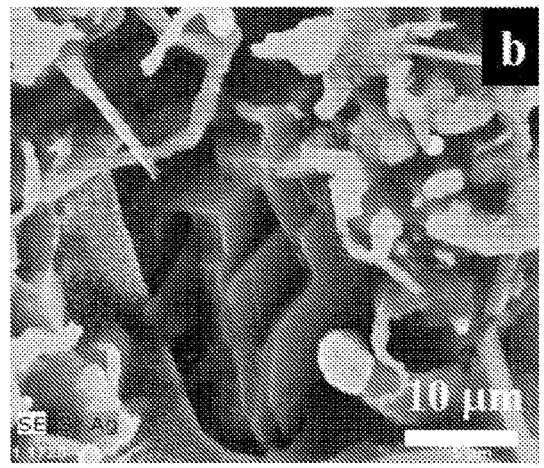
FIG. 10B depicts EDX element mapping of silicon deposited on silver in a higher magnification, compared to FIG. 10A.
Figure 10C:
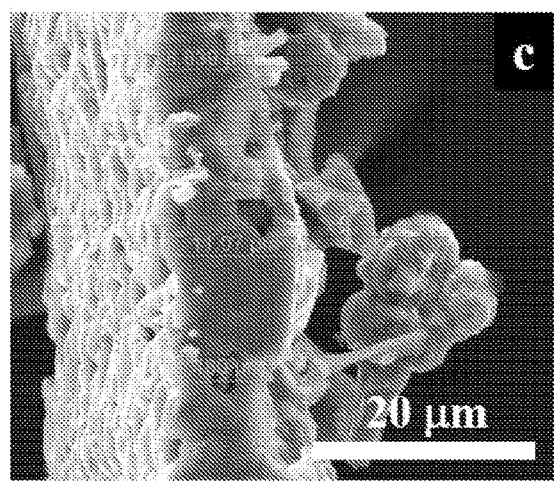
FIG. 10C depicts cross-sectional view of silicon deposited on silver break off from the substrate.
Figure 10D:
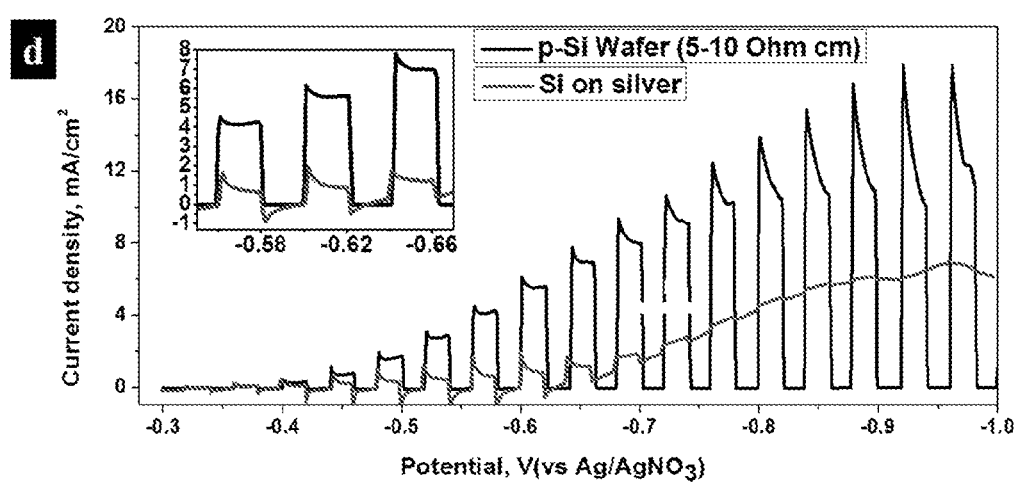
FIG. 10D shows the best PEC result of silicon deposited on a silver substrate, compared with a p-type wafer sample.

Comparison of Graphite Substrate with Silver and Discussion on Electrodeposition of Silicon for Solar Cell FIG. 10A depicts a typical SEM top-view image of a silicon deposit on silver, with inset digital picture of the as-deposited silicon on silver sample. FIG. 10B depicts EDX element mapping of the deposit in a higher magnification. FIG. 10C depicts cross-sectional view of the deposit break off from the substrate. FIG. 10D shows the best PEC result of silicon deposit on silver substrate (0.3M SiO$_2$ nanoparticles at 820° C. in CaCl$_2$, 5 mA/cm$^2$, and 6 h), compared with a p-type wafer sample (5-10 ohm·cm). Silver was the first substrate discovered for electrodeposition of photoactive silicon, however, on silver the deposit is not a dense film. The appearance of the deposit (FIG. 10A inset) is dark blue-black. From SEM observations, it is actually composed of various sizes of clusters on top and denser deposits with exposed silver below (FIG. 10A-10B). EDX mapping (FIG. 10B) shows a slot-like exposed silver substrate on the top of the substrate surface. This exposed silver substrate will generate dark current in a PEC test, and will easily short circuit the device with no insulation covering it. The relatively denser deposit is approximately 7 µm in thickness with holes and tunnels within for a 6 h deposit sample (FIG. 10C). FIG. 10D shows the best photocurrent for silicon on silver. Overall, the photocurrent value from the best sample of silicon on a silver substrate was 0.87 mA/cm$^2$ at −0.62 V vs Ag/AgNO$_3$ reference, which is half of the value from the graphite substrate discussed previously, and only 15% of the photocurrent of a p-type silicon wafer (5-10 ohm·cm). The best condition for silicon growth on a silver substrate, based on the PEC response, is 5 mA/cm$^2$, 6 h of deposit at 820° C. in CaCl$_2$ containing 0.3 M SiO$_2$ nanoparticles. The comparisons of the best deposit in terms of the PEC test result are listed in Table 2. Generally, silicon on graphite has less deposition time (1 h vs 6 h), less thickness (3.5 µm vs 7.0 µm) but a higher photocurrent (1.71 mA/cm$^2$ vs 0.87 mA/cm$^2$) and smaller dark current, displaying a better quality and denser silicon deposit and is the more promising substrate for application in a solid-state solar cell.

TABLE 2

Photocurrent densities of silicon films deposited on silver and graphite with reference to standard wafer

| | Si film on silver | Si film on graphite | Wafer |
| --- | --- | --- | --- |
| Electrodeposition condition | 5 mA/cm$^2$, 6 h, 820° C. | 6 mA/cm$^2$, 1 h, 850° C. | — |
| Thickness, µm | 7 | 3.5 | 500 |
| Photocurrent @ −0.62 V vs Ag/AgNO$_3$, mA/cm$^2$ | 0.87 | 1.71 | 5.60 |
| Photocurrent ratio | 16% | 31% | 100% |

The volumetric coefficient of thermal expansion for silver ($\alpha_{V,Ag}$=18.9×10$^{-6}$ K$^{-1}$) and silicon ($\alpha_{V,Si}$=4.68×10$^{-6}$ K$^{-1}$) are quite different, and this mismatch could explain the slot-like exposed silver substrate. Considering that silicon is deposited above 800° C. and must cool to room temperature before testing, the differential contraction of the two materials would have a strong influence on mechanical strength. While silver has good ductility and silicon is fragile with poor ductility, the silicon deposits may be easily crushed and peeled off by the contraction. The temperature for deposition on a silver substrate is preferably lower than 830° C., because above 830° C. the silver substrate breaks at the surface of the molten salt bath.

Figure 11:
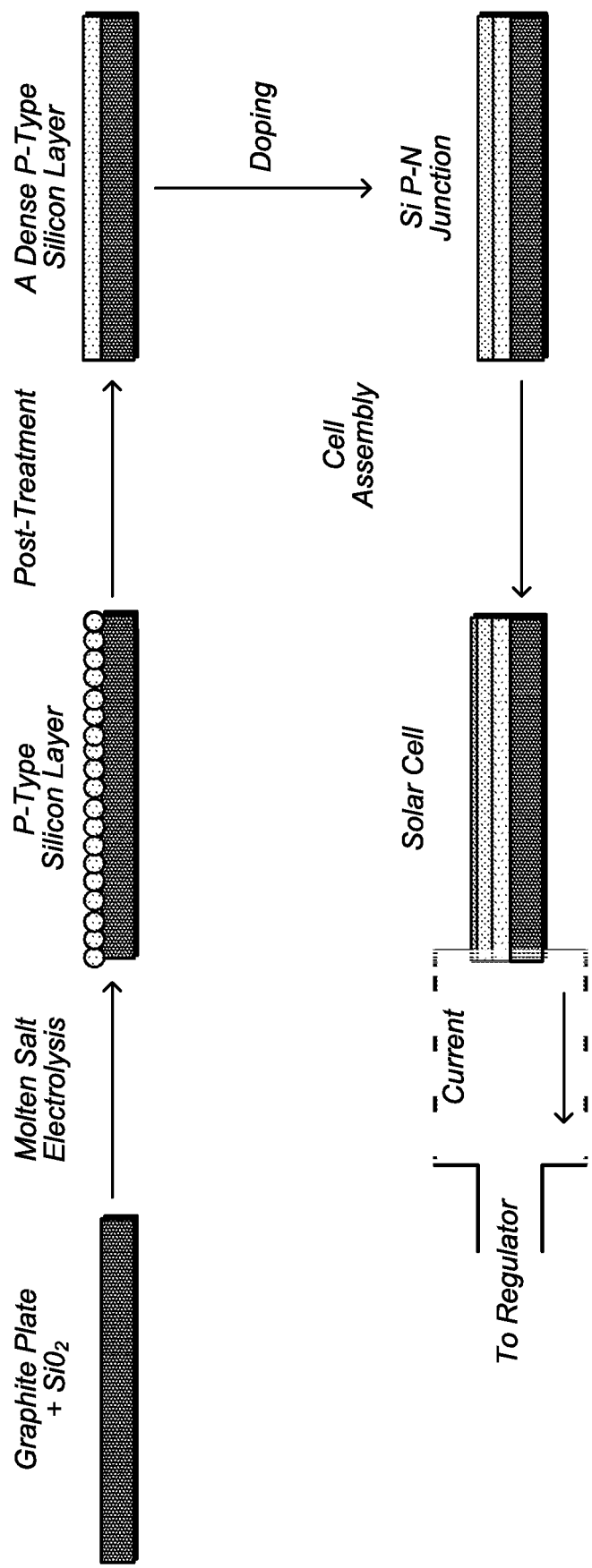
FIG. 11 depicts a schematic diagram of a process for electrodeposition of silicon on a graphite substrate.

Thin-film crystalline silicon solar cell is promising as a new type of low-cost silicon solar cell. A strategy for low-cost production of a silicon solar cell by means of electrodeposition is described in FIG. 11. In an embodiment, electrodeposition is used to prepare a p-type silicon layer, with possible post-treatment to improve the quality and morphology. After forming the p-type layer, the silicon is doped to make a p-n junction, either by a conventional method or preferably by an additional molten-salt electrolysis step to make an n-type layer. Finally, the cell is assembled with a front contact and packaging to prepare a thin-film crystalline silicon solar cell.

The key step for forming a thin-film crystalline solar cell is the first step: to prepare a good quality p-type silicon film on a low-cost substrate. The objectives for this film are: a) purity higher than 99.999% to reduce the recombination; b) thickness near 10 µm to achieve good light harvesting without complicated light-trapping structures; c) a pinhole-free film with surface roughness less than 1 µm in order to go directly to the next processing step.

Conclusions

Electrodeposition of photoactive silicon films can be a promising first step to pave the road to low-cost thin-film crystalline-silicon solar cells. The photoelectrochemical (PEC) cell method described herein has been systematically illustrated for fast and convenient testing of the quality of an as-deposited silicon film. The PEC method can identify pinholes or any exposed substrate by dark current, the quality of the semiconductor film by photocurrent, and can provide a simple comparison of results with a standard silicon wafer.

Graphite was discovered as a good substrate for electrodeposition of a photoactive dense silicon film from a chloride molten salt. The deposit on graphite was generally a dense film of several-micron thick, with a SiC interface between the graphite substrate and silicon film. Among different kinds of graphite substrates, the silicon film obtained on the POCO graphite showed the best performance in terms of the dark current, which was due to a lower density of the macro pores on the graphite surface. The current density of the electrolysis governed the grain size and coverage of the silicon film, and the best condition observed, in terms of PEC response, was 6 mA/cm$^2$, 1 h, in a CaCl$_2$ melt containing 0.3 M SiO$_2$ nanoparticles.

The best silicon deposits on graphite and silver substrates were compared. Silicon on graphite had a shorter deposition time (1 h vs 6 h), a smaller thickness (3.5 µm vs 7.0 µm) but still a higher photocurrent (1.71 mA/cm$^2$ vs 0.87 mA/cm$^2$) and smaller dark current. Thus the silicon deposits on graphite substrates were denser and of better quality and hence graphite is a more promising substrate for a silicon solid-state solar cell. The best photocurrent was 31% of that of our standard silicon wafer.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method of depositing silicon on a substrate comprising electrochemically reducing silicon dioxide particles in a molten salt to deposit silicon on a carbonaceous substrate, wherein the electrochemical reduction of the silicon dioxide particles is carried out at a constant current density, and wherein the constant current density is selected from a current in the range of 2 mA/cm$^2$ to 8 mA/cm$^2$.

2. The method of claim 1, wherein the silicon is deposited as a film on the carbonaceous substrate.

3. The method of claim 1, wherein the silicon is deposited as nanowires on the carbonaceous substrate.

4. The method of claim 1, wherein the molten salt comprises calcium chloride.

5. The method of claim 1, wherein the molten salt is at a temperature of less than about 1000° C.

6. The method of claim 1, wherein the carbonaceous substrate is a graphite substrate.

7. The method of claim 1, further comprising adding boron to the molten salt to produce a boron doped silicon film on the metal substrate.

8. The method of claim 1, wherein the silicon is deposited for a time of between about 0.75 hours and about 1.5 hours.

9. The method of claim 1, further comprising adding arsenic to the molten salt to produce an arsenic doped silicon film on the metal substrate.

10. The method of claim 1, further comprising adding phosphorus to the molten salt to produce a phosphorous doped silicon film on the metal substrate.

* * * * *